United States Patent [19]

Usui

[11] Patent Number: 4,866,648

[45] Date of Patent: Sep. 12, 1989

[54] DIGITAL FILTER

[75] Inventor: Akira Usui, Hamamatsu, Japan

[73] Assignee: Yamaha Corporation, Hamamatsu, Japan

[21] Appl. No.: 101,857

[22] Filed: Sep. 28, 1987

[30] Foreign Application Priority Data

Sep. 29, 1986 [JP] Japan .................................. 61-231060

[51] Int. Cl.$^4$ .............................................. G06F 7/48
[52] U.S. Cl. .................... 364/724.01; 364/748
[58] Field of Search ............... 364/724, 715, 736, 748, 364/754, 757, 724.01

[56] References Cited

U.S. PATENT DOCUMENTS 4,511,990  4/1985  Hagiwara et al. .................... 364/748

FOREIGN PATENT DOCUMENTS 0105518  5/1987  Japan .................................. 364/724

OTHER PUBLICATIONS

Finn, William J., "LSI Hardware Implements Signal Processing Algorithms", *Computer Design*, vol. 19, No. 3, Mar. 1980, pp. 137–142.

*Primary Examiner*—Steven Mottola
*Attorney, Agent, or Firm*—Spensley Horn Jubas & Lubitz

[57] ABSTRACT

A digital filter of an FIR (non-recursive) type operating as an oversampling filter in digital signal processing such as for a stereophonic audio device comprises a memory storing impulse response coefficient data, a mantissa data producing circuit for converting the coefficient data to mantissa data, a multiplier for multiplying input data with the mantissa data, an accumulator for accumulating output data of the multiplier, and a bit-shifting circuit for bit-shifting accumulated output data of the accumulator by the number of bits substantially corresponding to the change in the number of bits of exponent data in the coefficient data. The mantissa data is combined with input data in the convolution operation and the exponent data is imparted, in accumulation of multiplied values, by the bit-shifting of the accumulation output data. In one aspect of the invention, the bit-shifting is performed in a decreasing direction starting from the coefficient of the smallest exponent.

6 Claims, 11 Drawing Sheets

```
                    SIGN        SIGNIFICANT DIGITS
                    BIT            15 BITS
         C 1  = 0  1 0 1 0 0 0 1 0 1 1 1 1 1 0 0
         C 2  = 1 1 1 1 0 0 1 0 0 1 1 0 1 0 1 1 0
         C 3  = 0 0 0 1 0 0 0 0 0 1 0 0 1 1 0 0
         C 4  = 1 1 1 1 0 1 0 0 0 1 0 1 1 0 1 1
         C 5  = 0 0 0 0 1 0 0 1 0 0 0 0 1 1 0 1
         C 6  = 1 1 1 1 1 0 0 0 1 0 0 1 0 1 1 1
         C 7  = 0 0 0 0 0 1 1 0 0 1 0 0 0 1 0 0
         C 8  = 1 1 1 1 1 0 1 0 1 0 0 1 0 0 0 1
         C 9  = 0 0 0 0 0 1 0 0 1 1 0 0 1 0 1 1
         C 10 = 1 1 1 1 1 0 1 1 1 0 1 1 0 1 1 0
         C 11 = 0 0 0 0 0 0 1 1 1 1 1 0 0 0 0 1
         C 12 = 1 1 1 1 1 1 0 0 0 1 1 1 0 1 0 1
         C 13 = 0 0 0 0 0 0 1 1 0 1 0 0 0 0 1 0
         C 14 = 1 1 1 1 1 1 0 0 1 1 1 1 1 0 1 1
         C 15 = 0 0 0 0 0 0 1 0 1 1 0 0 1 1 1 1
         C 16 = 1 1 1 1 1 1 0 1 0 1 0 1 1 1 1 1
         C 17 = 0 0 0 0 0 0 1 0 0 1 1 1 1 0 0 0
         C 18 = 1 1 1 1 1 1 0 1 1 0 1 0 1 0 1 1
         C 19 = 0 0 0 0 0 0 1 0 0 0 1 1 0 0 1 1
         C 20 = 1 1 1 1 1 1 0 1 1 1 1 0 1 0 0 1
                                SIGNIFICANT DIGITS
                                    10 BITS
```

FIG. 4

```
                SIGN                        SIGNIFICANT DIGITS
                 BIT                           45 BITS
    C1 = 0 1 1 0 0 0 0 1 0 1 1 0 1 1 1 1 1 1 1 1 0 0 1 0 0 1 1 0 0 0 0 1 0 0 0 0 0 0 0 0 0 0 0 0 0 0
    C2 = 1 1 1 1 0 0 1 0 0 1 1 1 1 1 1 0 0 1 0 1 1 1 1 1 1 1 1 1 1 0 1 0 0 1 1 0 0 0 0 0 0 0 0 0 0 0
    C3 = 0 0 0 1 0 0 0 0 0 0 1 1 1 1 0 0 1 0 0 1 0 0 1 0 0 1 0 1 1 1 1 0 0 1 0 0 0 0 0 0 0 0 0 0 0 0
    C4 = 1 1 1 1 0 1 0 0 1 0 1 1 0 1 0 0 0 1 0 0 0 0 0 1 0 1 0 1 1 0 1 0 0 0 0 0 0 0 0 0 0 0 0 0 0 0
    C5 = 0 0 0 0 1 0 0 0 1 0 0 0 1 1 0 1 0 1 0 1 1 0 1 1 1 0 1 0 0 1 1 0 0 0 1 0 0 0 0 0 0 0 0 0 0 0
    C6 = 1 1 1 1 1 0 0 1 0 0 0 1 1 1 1 0 1 1 0 1 0 0 1 0 1 1 1 0 0 1 0 1 0 0 0 0 0 0 0 0 0 0 0 0 0 0
    C7 = 0 0 0 0 0 1 0 1 1 0 1 0 0 1 1 0 0 1 1 1 0 0 0 1 0 1 1 1 1 1 0 0 1 1 0 1 1 0 0 0 0 0 0 0 0 0
    C8 = 1 1 1 1 1 0 1 1 0 1 0 0 0 1 0 0 1 1 0 0 1 1 1 0 1 0 1 1 1 0 1 1 0 0 0 0 0 0 0 0 0 0 0 0 0 0
    C9 = 0 0 0 0 0 1 0 0 0 0 1 1 0 0 1 1 0 1 1 1 1 1 1 1 0 0 0 1 0 0 1 0 0 1 0 1 1 0 0 0 0 0 0 0 0 0
   C10 = 1 1 1 1 1 1 0 0 1 1 0 1 0 0 0 0 0 1 1 1 0 0 0 0 1 0 1 1 0 0 1 1 0 0 0 0 0 0 0 0 0 0 0 0 0 0
   C11 = 0 0 0 0 0 0 1 0 1 1 1 0 1 0 1 1 0 0 1 1 1 1 1 1 1 1 0 1 0 1 1 0 1 1 0 0 0 0 0 0 0 0 0 0 0 0
   C12 = 1 1 1 1 1 1 1 0 1 0 1 1 1 0 0 0 0 1 0 1 0 1 0 0 1 1 1 0 0 1 1 1 1 0 0 0 0 0 0 0 0 0 0 0 0 0
   C13 = 0 0 0 0 0 0 1 0 0 0 1 1 1 0 0 0 0 1 1 0 0 0 0 0 0 0 1 0 0 0 1 1 1 0 1 0 1 1 0 0 0 0 0 0 0 0
   C14 = 1 1 1 1 1 1 1 1 0 0 0 0 1 0 0 1 0 0 1 0 0 1 1 1 0 0 0 1 0 0 0 0 1 1 0 0 0 0 0 0 0 0 0 0 0 0
   C15 = 0 0 0 0 0 0 0 1 1 0 1 0 1 1 0 1 0 0 0 1 0 0 1 1 1 0 0 1 1 0 0 0 1 0 0 0 0 1 1 0 0 0 0 0 0 0
   C16 = 1 1 1 1 1 1 1 1 0 1 0 0 0 1 0 1 1 0 0 1 0 0 1 0 0 0 0 0 1 0 1 0 1 0 0 0 0 0 0 0 0 0 0 0 0 0
   C17 = 0 0 0 0 0 0 0 1 0 1 0 0 0 0 1 1 1 1 0 0 0 0 1 1 1 0 1 0 0 0 1 1 0 1 1 0 1 1 1 0 0 0 0 0 0 0
   C18 = 1 1 1 1 1 1 1 1 0 1 1 1 0 0 1 1 1 0 0 1 1 0 1 1 1 0 0 0 1 1 1 0 0 0 0 0 0 0 0 0 0 0 0 0 0 0
   C19 = 0 0 0 0 0 0 0 0 1 1 1 1 0 0 1 1 1 0 0 1 1 0 1 1 1 1 0 1 0 0 1 0 1 1 1 0 0 1 0 1 0 0 0 0 0 0
   C20 = 1 1 1 1 1 1 1 1 1 0 0 1 0 1 1 0 1 1 1 1 0 1 1 1 0 1 0 0 1 1 1 0 1 0 0 0 0 0 0 0 0 0 0 0 0 0
   C21 = 0 0 0 0 0 0 0 0 1 0 1 1 0 1 0 1 0 0 0 1 1 0 1 0 0 0 1 0 0 1 0 1 0 1 0 1 0 1 1 1 0 0 0 0 0 0
   C22 = 1 1 1 1 1 1 1 1 1 0 1 1 0 0 1 0 0 0 1 0 0 0 1 0 0 0 0 1 0 1 1 1 0 1 0 0 0 0 0 0 0 0 0 0 0 0
   C23 = 0 0 0 0 0 0 0 0 0 1 0 0 0 0 1 0 1 1 0 0 0 1 1 0 0 1 0 1 0 0 1 0 0 0 0 1 1 0 0 1 1 0 0 0 0 0
   C24 = 1 1 1 1 1 1 1 1 1 0 0 0 1 1 0 1 1 1 0 0 1 1 1 1 1 1 1 1 0 0 1 1 1 0 0 0 0 0 0 0 0 0 0 0 0 0
   C25 = 0 0 0 0 0 0 0 0 0 1 1 0 0 0 0 1 0 1 0 1 0 1 0 0 0 0 1 1 1 1 1 0 0 0 0 1 0 1 1 1 1 1 0 0 0 0
   C26 = 1 1 1 1 1 1 1 1 1 0 1 0 1 1 0 1 0 1 0 0 1 1 1 1 1 0 0 1 1 0 0 1 0 0 0 0 0 0 0 0 0 0 0 0 0 0
   C27 = 0 0 0 0 0 0 0 0 0 1 0 0 0 1 1 0 0 0 0 0 0 0 1 1 0 1 0 1 1 1 0 0 0 1 1 1 0 0 0 1 1 0 0 0 0 0
   C28 = 1 1 1 1 1 1 1 1 1 1 0 0 0 1 0 0 1 1 1 0 1 1 0 1 0 1 1 0 0 1 1 0 0 0 0 0 0 0 0 0 0 0 0 0 0 0
   C29 = 0 0 0 0 0 0 0 0 0 0 1 1 0 0 0 1 1 0 1 0 1 0 0 1 0 1 1 1 1 0 0 1 1 0 1 1 1 1 1 0 0 0 0 0 0 0
   C30 = 1 1 1 1 1 1 1 1 1 1 0 1 0 1 1 0 0 1 0 0 1 1 1 0 1 1 0 0 1 1 1 0 0 0 0 0 0 0 0 0 0 0 0 0 0 0
```

FIG. 8A

SIGN
BIT
↓

C31 = 00000000001000 10 10 1 10 10 10 10 1 100 1 100 1 0 0 1 0000000
C32 = 11111111111 0001100100 1 10 1000 10 10000000000000000
C33 = 000000000000 10 1 1 1 1 1 1000 10 10 100 1 1000000 10 1 1 1 1000
C34 = 11111111111 10 1 1000 100 1 10 1 10 1 100 10 10000000000000
C35 = 000000000001000000 10 1 10 100 1 10000000 10 1000 1 1000
C36 = 11111111111 1 00 1 0 1 1000 100 1 10 10 1 1000000000000000
C37 = 000000000000 10 10 1 1000 1 10 1 1 1 1000000 1 1 1 1 1 1 0 1 0000
C38 = 111111111111 10 1 1 10 1 1000 1000 1 100 1 000000000000000
C39 = 000000000000 1 1 10000 1 1 1 10 1 10 10 1 1 10 1 10 100 10 1 1 10
C40 = 111111111111 10 100 10 100 100 1 10 1 1 10000000000000000
C41 = 0000000000000 100 1000 10 1 1 1 1 1 10 100 10 10 10 10 1 1 1 10
C42 = 111111111111 000 1 100000000000 100000000000000
C43 = 000000000000 10 1 1 100000 10 1000 100 1 1 1 100 10 1 00 10
C44 = 1111111111111 10 1 10 1 1 100 1 1 10 10 1 1 1 1000000000000
C45 = 00000000000Q000 1 1 100 10 100000 100 10 10 100 1 1 1 10 10 1
C46 = 1111111111111 10 100 1 10 1 100 1 1 10 10 10000000000000
C47 = 000000000000000 1000 10 1 1 1 1 10000 10 10 10 1000 1000 10
C48 = 1111111111111 00 100 1 10 1 10 10 10 1 10000000000000
C49 = 000000000000000 10 100 1 1 1 1 10 100000 1000 1 1 10 1 1 100
C50 = 11111111111111 10 1 1 1 1 10 1 1 10 10 10000000000000000
C51 = 000000000000000 1 1000 10 1 10 10 1 1 1 1 1 10 100 10 10 10 1
C52 = 111111111111111 0 1 10 100 10 10 100 1 1000000000000000
C53 = 000000000000Q0000 1 1 100 100 10 1000 1000 10 1 1 1 1 1 10 1
C54 = 111111111111111 0 10 100 1 10 10 1 1000000000000000
C55 = 000000000000000001000000 1 1 100 1000 1 10000 1 1 1 10
C56 = 1111111111111111 00 1 1 1 10 1 1 100 1 10000000000000

⎫
⎬ SIGNIFICANT DIGITS
⎭ 27 BITS

FIG. 8B

DIGITAL FILTER

BACKGROUND OF THE INVENTION

This invention relates to a digital filter using convolution operation and being capable of performing operation accurately with a relatively short word length.

In a Compact Disc player in the Compact Disc Digital Audio System, for example, a digital filter is disposed in the former stage of a digital-to-analog converter provided for converting a reproduced PCM signal to an analog signal and is utilized for, for example, alleviating the burden imposed on a low-pass filter provided in the latter stage of the digital-to-analog converter.

A digital filter performs, as shown by an FIR (non-recursive) type digital filter in FIG. 2, for example, convolution operation according to which an input sample xi is sequentially and successively delayed by one sample by delay circuits 10-1, 10-2, . . . 10-20, delayed signals are multiplied with coefficients $C_{-10}$, $C_{-9}$, . . . , $C_0$, . . . , $C_{10}$ corresponding to impulse response of the filter by coefficient multipliers 12-1, 1, 12-2, 12-21 and results of the multiplication are all accumulated by an accumulator (adder) 14.

In a case where an ideal filter as shown in FIG. 3 is realized, these coefficients of the convolution operation are given by a general formula:

$$\frac{\sin \frac{\pi}{2} n}{n\pi}$$

If they are expressed in binary 16 bits, they assume values shown in FIG. 4. Since coefficients of the ideal filter are symmetrical with respect to $t=0$ as shown in FIG. 3 (they become $C_1 = C_{-1}$, $C_2 = C_{-2}$, . . . in the example of FIG. 2), only one side of the symmetrical coefficients is shown in FIG. 4.

The representation in FIG. 4 is made by using 2's complement which is a form of binary code. In 2's complement, MSB (most significant bit) constitutes a sign bit. If the sign bit is "0", it represents a positive value whereas if the sign bit is "1", it represents a negative value. The lower is the order of digit at which the code is turned from 1 to 0 or from 0 to 1 for the first time as viewed in the direction from MSB to LSB, the smaller becomes the value of the coefficient.

In the conventional Compact Disc player, a digital filter of a fixed decimal point operation type as shown in FIG. 4 in which coefficients are used for the convolution operation without any modification is generally used.

As will be understood from FIG. 4, there are both large values and small values in coefficients used for the convolution operation in a digital filter. If coefficients of such various values are expressed with the same word length (16 bits in FIG. 4), several leftmost bits are not used for relatively small coefficients but a reduced number of bits are used for expressing such small coefficients (in the example of FIG. 4, for example, the coefficient $C_1$ (coefficient adjacent to the center of impulse response) has 15 significant digits whereas the coefficient $C_{20}$ has only 10 significant digits) so that the accuracy of the coefficient is substantially reduced as the value of the coefficient decreases.

Further, since the word length for expressing the coefficient is limited, digits less than LSB are rounded (e.g., discarded) in each coefficient with a result that each coefficient has a rounding error. If, accordingly, the convolution operation is performed under this condition, rounding errors are accumulated by the accumulation function performed by an accumulator and are carried to a higher order with a resulting decrease in the accuracy of the filter. Such decrease in the accuracy produces a ripple in the frequency characteristics of the filter.

For preventing carrying of the rounding error to a higher order bit in the fixed decimal point operation type digital filter, the accumulator must have spare bits corresponding to the number of times of accumulation in the convolution operation in addition to normal bits (i.e., bits outputted as a value resulting from the convolution operation). If, for example, the accumulation function is performed 1024 times, 10 extra bits must be added to the LSB of normal bits. Thus, the word length of the accumulator becomes unduly long for the number of bits which are finally delivered out as the value of the convolution operation.

It is, therefore, an object of the invention to provide a digital filter capable of performing the convolution operation accurately with a shorter operation word length.

SUMMARY OF THE INVENTION

For achieving the above described object of the invention, there is provided a digital filter which is characterized in that it comprises a memory storing impulse response coefficient data, mantissa data producing means for converting the coefficient data to mantissa data of a predetermined bit number, a multiplier for multiplying input data with the mantissa data, an accumulator for accumulating output data of the multiplier, and bit-shifting means for bit-shifting accumulated output data of the accumulator by the number of bits substantially corresponding to the change in the number of bits of exponent data in the coefficient data.

According to the invention, the coefficient is divided into exponent and mantissa and mantissa data is operated with input data in the convolution operation. Exponent is imparted, in accumulation of multiplied values, by shifting the bits of the present accumulated value by the number of bits corresponding to the change in exponent, i.e., the difference in the exponent value between the present coefficient and the immediately preceding coefficient. Further, by performing the accumulation starting from the coefficient of the smallest exponent, shifting of bits is performed in a decreasing direction.

In the present invention, this operation is referred to as "exponent difference type floating decimal point operation". The term "exponent difference type" herein designates a type having information representing difference value in the exponent instead of information representing the value of the exponent per se. The exponent of the coefficient is information representing the number of digits of the coefficient and the mantissa of the coefficient is information representing a value obtained by dividing the coefficient by the exponent (i.e., information including value of significant digits), i.e., there being a relation of coefficient = mantissa x (exponent power of 2). If, for example, the coefficient is expressed by 000111 (excluding the sign bit) and the 3 leftmost bits constitute the exponent, 111 constitute the mantissa. If the 2 leftmost bits constitute the exponent in this example, 0111 constitute the mantissa. If one leftmost bit constitutes the exponent, 00111 constitute the mantissa.

According to the invention, since the coefficient is divided into mantissa and exponent and the convolution operation (floating decimal point operation) is performed by using the mantissa only, all bits of the word length prepared for expressing coefficient data in the convolution operation can be utilized for expressing mantissa data so that the coefficient can be expressed with equal accuracy regardless of the magnitude of the coefficient. Accordingly, in spite of a relatively small number of bits used for expressing the coefficient, an error in expressing the coefficient is reduced and the operation word length of a multiplier can be shortened.

In a case where a conventional floating decimal point operation is used instead of the exponent difference type floating decimal point operation, values representing exponents (not difference value in exponent) are imparted after multiplication and added by the accumulator. In this case also, the coefficient in the multiplication can be shortened as in the case of the difference exponent type filter and the operation word length of the multiplier can also be shortened. Since, however, the exponent value itself is imparted to the output of multiplication, the word length of the accumulator has to become long as in the case of the fixed decimal point operation type filter. The word length of the accumulator can be shortened only, as according to this invention, by imparting difference value in exponent to the output of multiplication by the exponent difference type floating decimal point operation and also performing accumulation from a coefficient of the smallest exponent.

As to exponent information, it is sufficient in the present invention to have information concerning the difference in the exponent only so that the word length of exponent information can be shortened as compared to exponent information representing the value of the exponent itself. If, for example, there are exponents $2^{-14}$ and $2^{-15}$, exponent information of $-15-(-14)=-1$, i.e., 1 bit, has only to be imparted to the latter instead of exponent information of $-15$ and $-14$ as in the prior art digital filter and, .accordingly, the number of bits required for expressing exponent information can be remarkably reduced. Besides, since the operation is performed in the order from the smallest exponent, the direction of bit shifting is always the same (decreasing direction) so that information concerning the bit shifting direction is unnecessary.

For producing exponent information, the following methods can be employed:

(1) A method according to which a coefficient obtained with high accuracy is divided into mantissa and exponent and mantissa information and exponent information are stored in a ROM.

(2) A method according to which a highly accurate coefficient itself is stored in a ROM and mantissa data and exponent data are generated from the read out coefficient data from the ROM as required in the operation process.

(3) A method according to which a coefficient is divided into mantissa and exponent in such a manner that the exponent changes periodically and bit-shifting is performed simply by counting the times of the operation (this is the method employed in the embodiment as described later.) This is equivalent to substituting hardware for exponent information.

Further, according to the invention, the effect of preventing occurrence of the rounding error and an effect of effectively utilizing minute data can be obtained by performing the exponent difference type floating decimal point operation and the accumulation from the smallest exponent.

Even if rounding errors have been accumulated by the convolution operation, the bit-shifting in the decreasing direction for imparting exponents causes the accumulated value of rounding errors to be bit-shifted in the decreasing direction with a result that an increase in the rounding error can be prevented. Accordingly, the necessity for having extra bits added to LSB for preventing carry of the rounding error to a higher order bit as in the prior art filter is obviated whereby the operation word length of the accumulator can be further shortened.

Further, in a case where there are data A and B (A>B) in which $$\text{data } A: \underbrace{1\ 0\ 0\ \ldots\ 0}_{19 \text{ bits}}$$

(where the leftmost 1 is sign bit)

$$\text{data } B: \underbrace{0\ 0\ 0\ \ldots\ \underbrace{0 0\ \ldots\ 0\ 1}_{10 \text{ bits}}}_{19 \text{ bits}}$$

(where the leftmost 0 is sign bit)

and the operation of adding the data B 1024 times to the data A by the 19-bit accumulator, i.e., $$A + \underbrace{B + B + \ldots + B}_{1024 \text{ times}}$$

is performed, if the accumulation is performed starting from the data A having a larger exponent (i.e., having a larger value of coefficient), the data A is initially set in the 19-bit accumulator and subsequent accumulation of the data B will always result in discarding of the data B as an error (because the data B is of a lower order than the LSB of the accumulator). Thus, data remaining after the accumulation of the data B 1024 times will always be the data A only with the minute data B being neglected.

According to the invention, the accumulation is performed starting from the data B which is of a smaller exponent (i.e., the value of the coefficient is smaller) and the data B is initially operated so that, by accumulating the data B 1024 times, "1" at 29th significant bit, i.e., LSB, of the data B is shifted over ten bits leftwards and appears at LSB of the 19-bit accumulator which is performing the floating operation, that is, $$\underbrace{0\ 0\ 0\ \ldots\ 1}_{19 \text{ bits}}.$$

This data is effective with respect to the data A which is finally added to the data B so that the sum data becomes $$\underbrace{1\ 0\ 0\ \ldots\ 1}_{19 \text{ bits}}$$

and, accordingly, the minute data B is utilized effectively.

In the foregoing manner, the digital filter according to the invention can utilize minute data effectively while preventing accumulation of the rounding error.

Preferred embodiments of the invention will now be described with reference to the accompanying drawings.

BRIEF DESCRIPTION OF THE DRAWINGS

In the accompanying drawings,

FIG. 4 is a diagram showing an example of coefficients used for the fixed decimal point operation in the prior art digital filter for a Compact Disc player;

FIGS. 8A and 8B are diagrams showing coefficient data used for primary double oversampling in the digital filter for the Compact Disc player;

DESCRIPTION OF PREFERRED EMBODIMENTS

Figure 1:
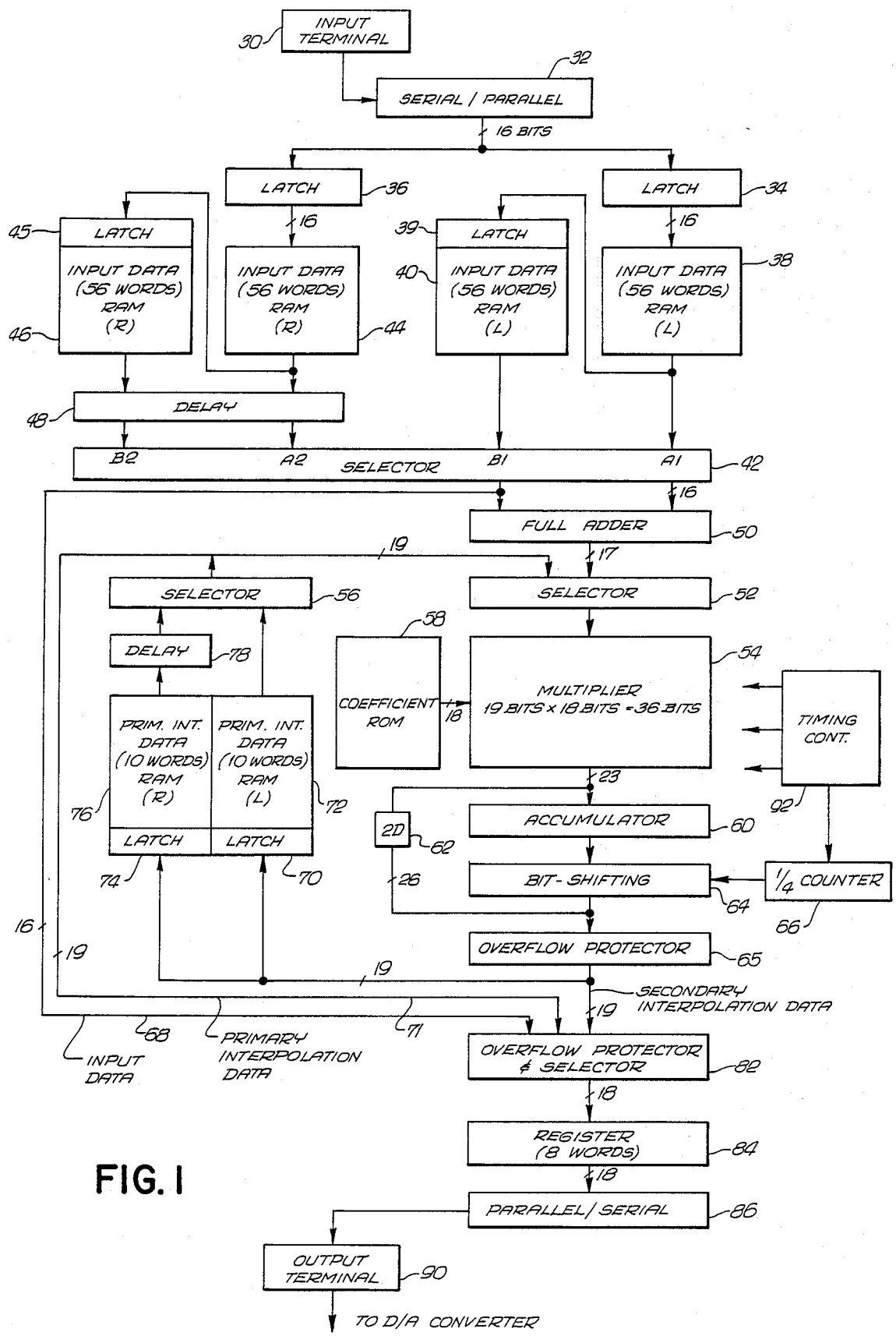
FIG. 1 is a block diagram showing an embodiment in which the invention has been applied to a digital filter before digital-to-analog conversion in a Compact Disc player.
Figure 2:
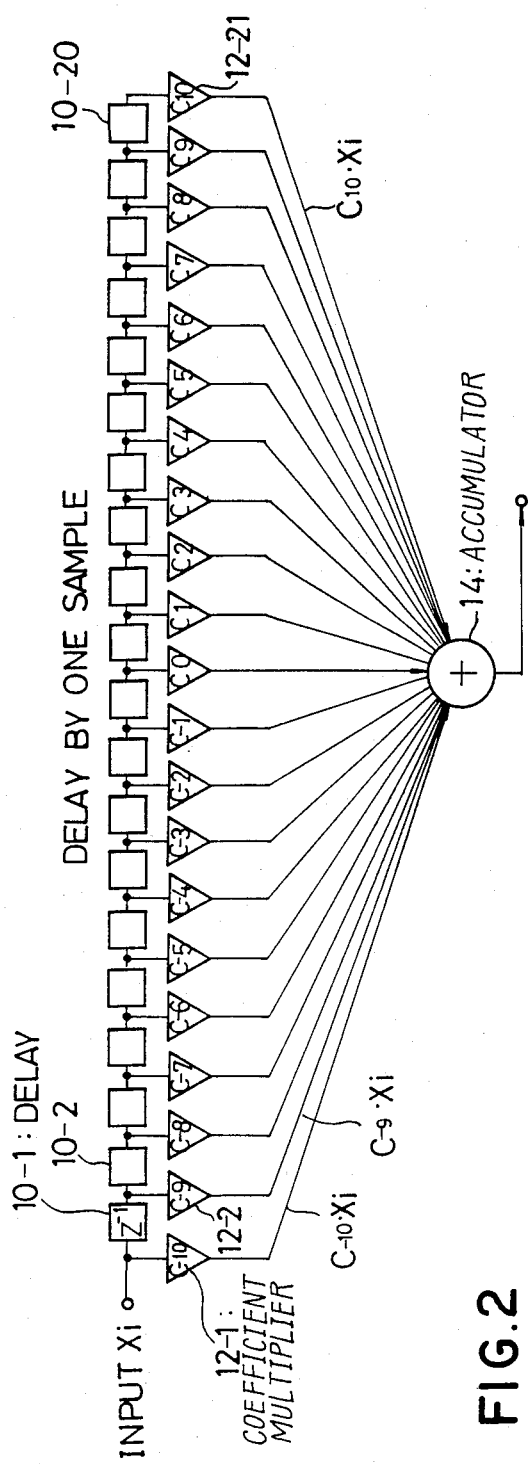
FIG. 2 is a circuit diagram showing the principle of a digital filter employing the convolution operation.
Figure 3:
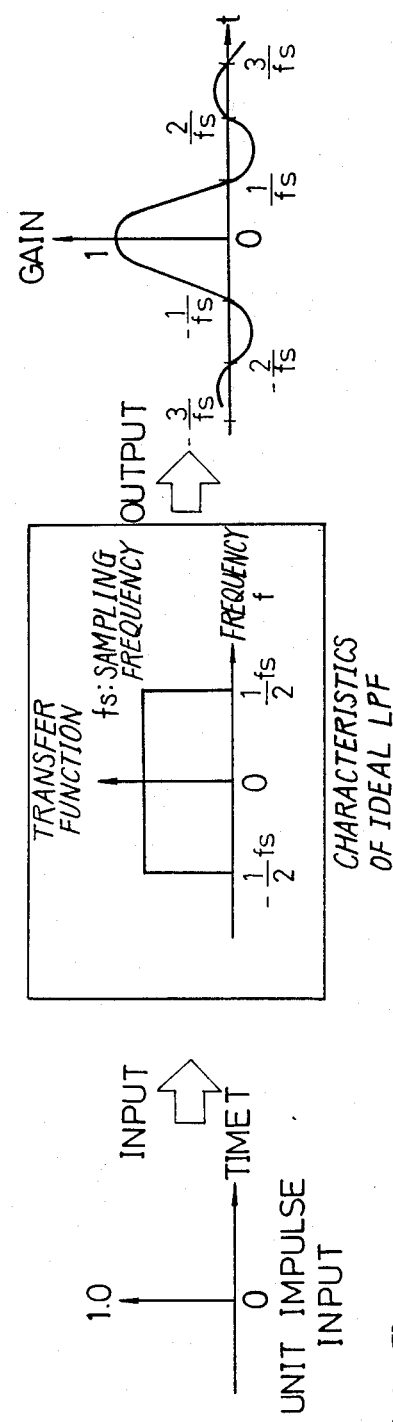
FIG. 3 is a diagram showing impulse response of an ideal filter.

An embodiment of the invention applied to a signal processing in a Compact Disc player is shown in FIG. 1.

In this embodiment, a digital filter performing quadruple oversampling is constructed by cascade-connecting two FIR filters of linear phase characteristics, one FIR filter being of 225 stages at ½ fs (fs representing sampling frequency of input signal) and the other FIR filter being of 41 stages at ¼ fs. This digital filter achieves a pass band ripple within ±0.0001 dB and an attenuating band attenuation of 100 dB. Owing to the linear phase characteristics of the digital filter, group delay characteristics of the digital filter are constant.

Utilizing the phenomenon that left and right coefficients of impulse response become symmetrical owing to the linear phase characteristics, the digital filter according to the invention reduces the number of times of multiplication by performing addition first and multiplication later. By this arrangement, the digital filter performs, at a high speed of 8.64 MHz, multiplication and addition totalling 96 times by the first stage filter (primary oversampling filter) and the second stage filter (secondary oversampling filter) for preparing one primary interpolation data by the primary oversampling using 56 addition and multiplication and two secondary interpolation data by the secondary oversampling using 20×2=40 addition and multiplication, resulting in multiplication and addition totalling 192 times including both left and right channels for one data of a Compact Disc (as the input data, there are 112 input data for one channel, totalling 224 input data for both left and right channels). As a final output, the digital filter produces four data consisting of one input data, one primary interpolation data and two secondary interpolation data for one input data in 18 bits. By outputting data of a Compact Disc which originally is 16 bits in 18 bits, a digital-to-analog converter provided in a post stage can perform a high-bit signal processing (i.e., shifting up a digital signal by 2 bits when the amplitude of the signal is small and thereafter attenuating the amplitude to ¼ after converting the signal to an analog signal thereby reducing an error to ¼ after the digital-to-analog conversion).

Figure 5:
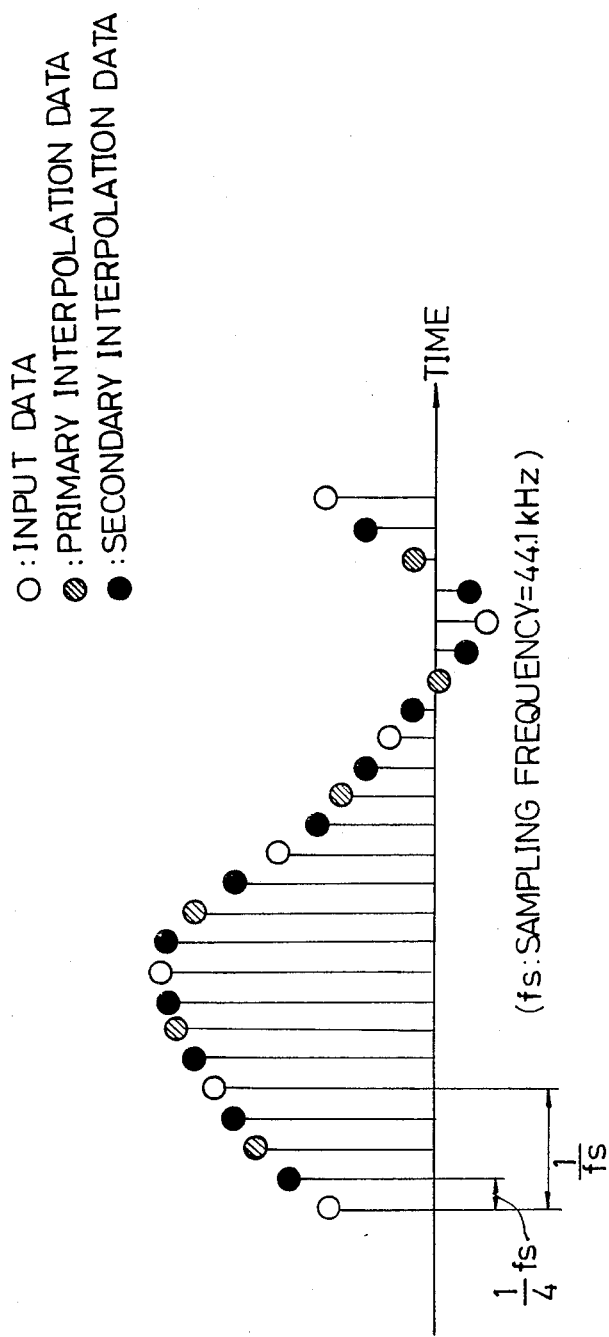
FIG. 5 is a view for explaining quadruple oversampling used in the invention.

For achieving quadruple oversampling in this embodiment, a set of multiplier and accumulator is used in the convolution operation. The set of multiplier and accumulator is used on a time shared basis for the left and right channels for performing the primary double oversampling and the secondary double oversampling. More specifically, when one new data is applied for the left and right channels, the convolution operation is initially performed for the input data of the left and right channels alternately by the primary double oversampling thereby producing one primary interpolation data for each of the left and right channels at an intermediate timing between the inputs with respect to the left and right channels. Upon the production of the primary interpolation data, the convolution operation is performed for the input data and the primary interpolation data alternately for the left and right channels by the secondary double oversampling thereby producing two secondary interpolation data on both sides of the primary interpolation data at an intermediate timing between the input data and the primary interpolation data for each of the left and right channels. Thus, as shown in FIG. 5, four data consisting of one input data, one primary interpolation data and two secondary interpolation data are obtained during one sampling period 1/fs of an input signal and are delivered out sequentially at a period of ¼ fs whereby a quadruple oversampling output is obtained.

In performing the convolution operation, multiplication is performed by using mantissa data of coefficients from a coefficient of the smallest exponent while exponent is imparted by bit-shifting the accumulated value in the decreasing direction by an amount of difference in the exponent.

Utilizing the fact that the coefficients of the digital filter for a Compact Disc decrease monotonously with MSB of the significant digits being positioned at a bit which is one bit lower every four coefficients, this embodiment establishes mantissa so that every four coefficients have the same exponent and performs shift down of one bit every four operations. Thus, by substituting exponent information by hardware, the embodiment obviates provision of an exponent section in a coefficient ROM despite employing the floating decimal point operation.

Figure 6:
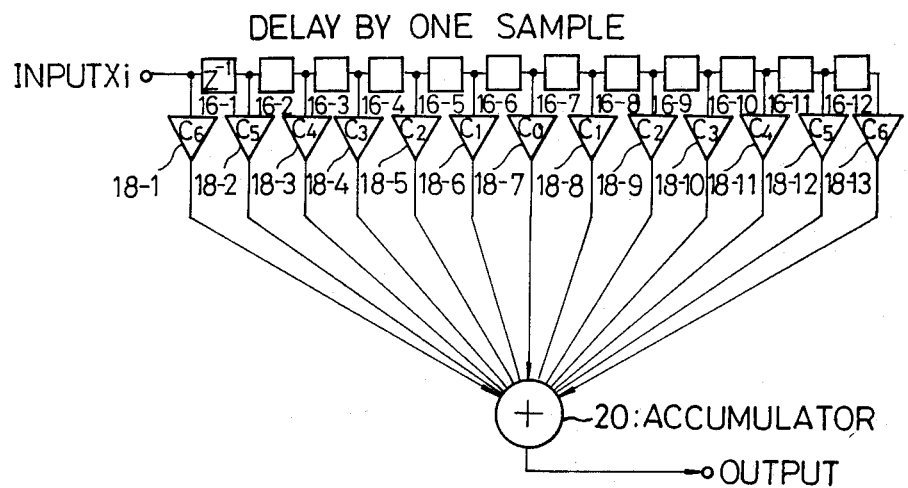
FIG. 6 is a circuit diagram showing the principle of a digital filter having linear phase characteristics.

In the digital filter shown in FIG. 1, a linear phase FIR filter is constructed as described above. As shown in FIG. 6, the linear phase FIR filter is realized by successively delaying an input sample xi by one sample by delay circuits 16-1, 16-2, ..., multiplying the input signal and the respective delayed signals with coefficient Ci (i=0, 1, 2, ...) by coefficient multiplier 18-1, 18-2, ... and accumulating results of the multiplication by an accumulator 20. The coefficients become symmetrical with respect to Co in the case of the digital filter of the linear phase characteristics.

Figure 7:
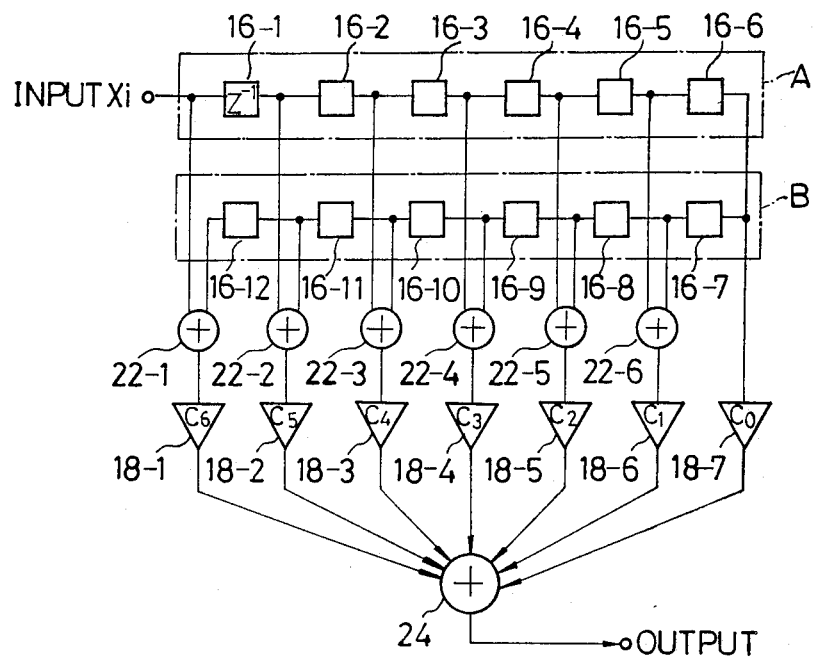
FIG. 7 is a circuit diagram showing the operation performed in the circuit of FIG. 6 in a simplified form.

Therefore, in the primary oversampling filter of this embodiment, as shown in FIG. 7, samples which are to be multiplied with the same coefficient are initially added together by adders 22-1, 22-2, ... and thereafter the sum of these samples is multiplied with a coefficient (mantissa) by coefficient multiplier 18-1, 18-2 ... and results of multiplication are accumulated by an adder 24. This arrangement enables the number of times of multiplication to be reduced to about half whereby an efficient operation can be achieved.

The secondary oversampling filter has filter characteristics different from those of the primary oversampling filter and multiplies coefficients (mantissa) for each delayed data as in the primary oversampling filter.

In FIG. 1, to an input terminal 30 are alternately applied 16-bit serial data for the left and right channels reproduced from a Compact Disc. The applied serial data are converted to parallel signals by a serial-to-parallel conversion circuit 32. The left channel data among the converted data is latched by a latch circuit 34 and the right channel data among the converted data is latched by a latch circuit 36 so that the converted data are sorted out as the left and right channel data.

The latch circuits 34 and 36 are provided for synchronizing purposes. More specifically, since RAMs 38 and 44 provided in post stage cannot effect reading and writing simultaneously, the data are held temporarily by these latch circuits 34 and 36 so as to enable the RAMs 38 and 44 to effect writing and reading at a convenient time respectively during the convolution operation.

The data of the left channel latched by the latch circuit 34 are successively applied to the RAM 38 having a capacity of 56 words and delivered out of the RAM 38 after being delayed by 56 samples. The left channel data delivered out of the RAM 38 are successively applied to the RAM 40 having a capacity of 56 words through a latch circuit 39 which, like the latch circuit 34, is provided for synchronization purpose. The data are successively erased after being delayed by 56 samples by the RAM 40. In this manner, newest 112 data of the left channel are held by the RAMs 38 and 40.

The reason for dividing the RAM into two blocks of RAMs 38 and 40 is that, for performing the convolution operation with reduced multiplication times as shown in FIG. 7 by utilizing the symmetrical sequence of coefficients in the digital filter of the linear phase characteristics, it is necessary to store two data which are multiplied with a common coefficient in the separate RAMs 38 and 40 and take them out simultaneously. The RAMs 38 and 40 correspond to the delay circuits A and B in the diagram showing the principle of the linear phase FIR filter in FIG. 7.

The data multiplied with the common coefficients are successively read out from the RAMs 38 and 40 in pairs and supplied to terminals A1 and B1 of a selector 42.

The data of the right channel latched by the latch circuit 36 are successively applied to a RAM 44 having a capacity of 56 words and are successively delivered out of the RAMs 44 after being delayed by 56 samples. The data of the right channel thereafter are successively applied to a RAM 46 having a capacity of 56 words through a latch circuit 45 which, like the latch circuit 36, is provided for synchronizing purpose. The data applied to the RAM 46 are successively erased after being delayed by 56 samples. In this manner, newest 112 data of the right channel are held by the RAMs 44 and 46.

Like the RAMs 38 and 40, the RAMs 44 and 46 correspond to the delay circuits A and B in the linear phase FIR filter shown in FIG. 7.

The right channel data multiplied with the common coefficients are successively read out from the RAMs 44 and 46 in pairs and supplied to terminals A2 and B2 of the selector 42.

A delay circuit 48 is provided for matching timing in processing the left channel signal and the right channel signal on a time shared basis.

For performing the convolution operation on a time shared basis, the selector 42 selects and outputs the left channel signals applied to the terminals A1 and B1 and the right channel signals applied to the terminals A2 and B2 alternately. A full adder 50 corresponds to the adders 22-1, 22-2, ... provided before the multiplication in FIG. 7 and adds the left channel data applied to the terminals A1 and B1 together and the right channel data applied to the terminals A2 and B2 together alternately.

The output of the full adder 50 is applied to a selector 52. The selector 52 is provided for selecting data used for the primary oversampling and the secondary oversampling. The selector 52 selects the output of the full adder 50 (A1+B1 or A2+B2) during the primary oversampling. The selector 52 selects the output of the full adder 50 (B1 or B2, i.e., not the sum data but one of the data held by the RAMs 40 and 46) and one primary interpolation data from a RAM 72 or 76 which is prepared by the primary oversampling.

A multiplier 54 performs multiplication in the convolution operation and is used on a time shared basis with respect to the primary oversampling and the secondary oversampling and also with respect to the left and right channels in each of the primary and secondary oversamplings.

A coefficient ROM 58 stores coefficients for the primary oversampling and those for the secondary oversampling (respectively common for the left and right channels) in the form of mantissa.

The primary oversampling is performed by using coefficients of 225 orders. Since multiplication of zero data is unnecessary, input data held by the RAMs 40 and 46 are directly provided on an output line 68 in the case of zero data. In the low-pass filter with the pass band of ½ fs, every other coefficient becomes zero so that 112 coefficients have only to be stored. Furthermore, since there are pairs of common coefficients, the coefficient ROM 58 stores 56 coefficients which are half of the 112 coefficients as coefficients (mantissa) for the primary oversampling.

An example of data (C1 through C56) for these 56 coefficients before they are converted to mantissa is shown in FIGS. 8A and 8B. In this example, each data is expressed in 46 bits in the 2's complemental binary code. In each data, MSB represents a sign bit and, the further is the position at which the code changes (shown by a solid line) from MSB, the smaller is the value of the coefficient. The significant digits of the data C1 whose value of the coefficient is the largest are 45 bits whereas the significant digits of the data C56 whose value of the coefficient is the smallest are only 27 bits, there being difference of 18 bits between the two data.

In producing mantissa data N1 through N56 used in this invention on the basis of the coefficient data C1 through C56, mantissa data can be produced in the order of the magnitude of exponent from this sequence without changing the order of the coefficients, for the digital filter for a Compact Disc player has monotonous decrease characteristics.

Figure 9:
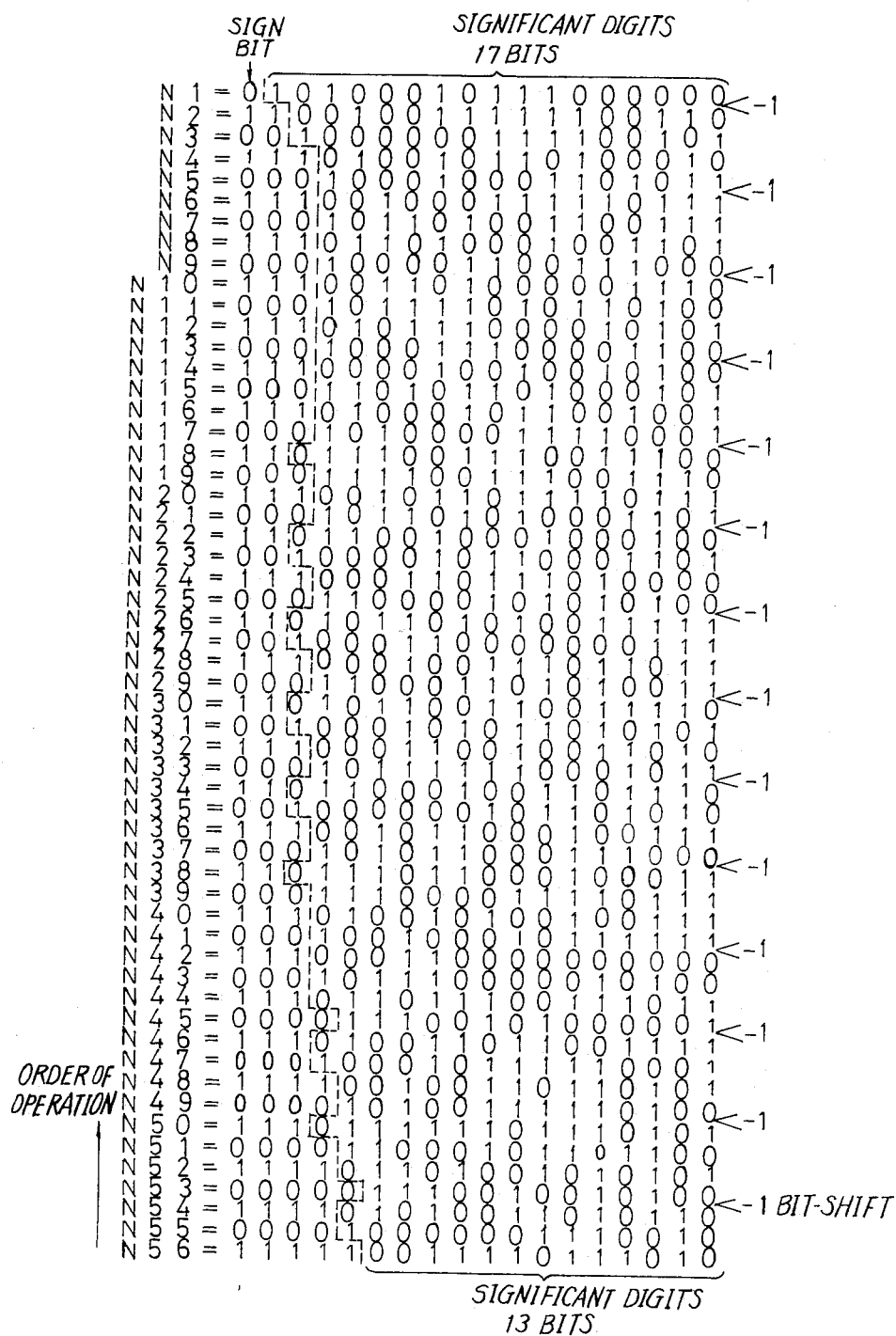
FIG. 9 is a diagram showing mantissa data used for the primary double oversampling by the exponent difference type floating decimal point operation performed in the circuit of FIG. 1, the mantissa data being prepared on the basis of the data shown in FIGS. 8A and 8B.

An example of mantissa data N1 through N56 produced on the basis of the coefficient data C1 through C56 of FIGS. 8A and 8B is shown in FIG. 9. The mantissa data N1 through N56 are respectively data of 18 bits with MSB constituting a sign bit. In the mantissa data N1 through N56, the exponent changes by one bit every four coefficients. In the coefficient data C1 through C56, the position at which exponent is separated from mantissa is shown by a dotted line in FIGS. 8A and 8B. By changing the exponent by one bit every four coefficients, the mantissa data N1 through N56 can have substantially constant significant digits. For example, the significant digits of the largest mantissa data N1 is 17 bits whereas the significant digits of the smallest mantissa data N56 is 13 bits with difference between the two data being only 4 bits. Accordingly, an operation can be made with high accuracy even with a small coefficient (in terms of the coefficient data C56, the smallest mantissa data N56 contains information from MSB to the 32nd bit).

In the coefficient ROM 58 shown in FIG. 1, the mantissa data N1 through N56 of FIG. 9 are read out from one of the smallest exponent (i.e., in the order of N56, N55, N54, ... N2, N1). The read out mantissa data N56 through N1 are multiplied in the multiplier 54 with corresponding input data provided by the selector 52. More specifically, the mantissa data N56 is multiplied with a sum of the oldest input data and the newest input data held by the RAMs 38 and 40 (or RAMs 44 and 46). The next mantissa data N55 is multiplied with a sum of the second oldest data and the second newest data held by these RAMs. The multiplication of 56 sets of data is sequentially carried out in this manner. Since the mantissa data N56 through N1 are used commonly for both of the input data of the left and right channels, multiplication of the left channel input data and multiplication of the right channel input data are carried out on a time shared basis while one mantissa data is being read out from the coefficient ROM 58. In the foregoing manner, the multiplier 54 performs multiplication once with respect to corresponding input data of the left and right channels each time the mantissa data is read out from the coefficient ROM 58. By this operation, 56 results of multiplication for each of the left and right channels are provided alternately from the multiplier 54.

Since the multiplier 54 performs multiplication of input data of 19 bits and mantissa data of 18 bits respectively expressed in 2's complement, the operation word length of the multiplier 54 becomes 36 bits and the multiplier 54 outputs 23 leftmost bits in each multiplication data as result of multiplication.

An accumulator 60 successively receives 56 multiplication data representing results of the multiplication by the multiplier 54 for each of the left and right channels and accumulates these data for each of the left and right channels. For performing the accumulation, the accumulator 60 feeds back its output to its input side after delaying the output by two data by a delay circuit 62 and adds the fed back data to new multiplication data supplied from the multiplier 54. The output of the accumulator 60 is delayed by two data by the delay circuit 62 because the multiplication data for the left and right channels are alternately supplied from the multiplier 54. By this arrangement, the multiplication data for the left channel are accumulated together an the multiplication data for the right channel are accumulated together.

In this accumulation, each time the exponent changes (the position at which the exponent changes is shown by the sign < at the right of the data in FIG. 9), the accumulated data is bit-shifted by a bit-shifting circuit 64 by one bit in the decreasing direction (i.e., towards LSB). Each bit-shifting is by one bit because the exponent is caused to change by one bit in preparing the mantissa data, however the amount of shifting is not limited to one bit but may be more than one bit depending upon the manner of preparing the mantissa data. By this bit-shifting operation, relative imparting of the exponent is achieved whereby multiplication data of a smaller exponent becomes a smaller value and the exponent difference type floating decimal point operation is realized.

Since the exponent is changed by one bit every four coefficients in preparing the mantissa data, the above described bit-shifting is also carried out every four times of accumulation for each of the left and right channels. For this purpose, in the present embodiment, the number of times of accumulation is counted by a ¼ counter 66 and the accumulated data is shifted down by one bit every four times of accumulation for each of the left and right channels. Storing of exponent data in the coefficient ROM 58 therefore is unnecessary so that the capacity of the coefficient ROM 58 can be reduced.

In the foregoing manner, by performing accumulation 56 times for each of the left and right channels in the accumulator 60, final accumulated data for each channel is obtained. This constitutes the primary interpolation data which is interposed at the central portion between two adjacent data held by the RAMs 38 and 40 (RAMs 44 and 46).

Figure 10:
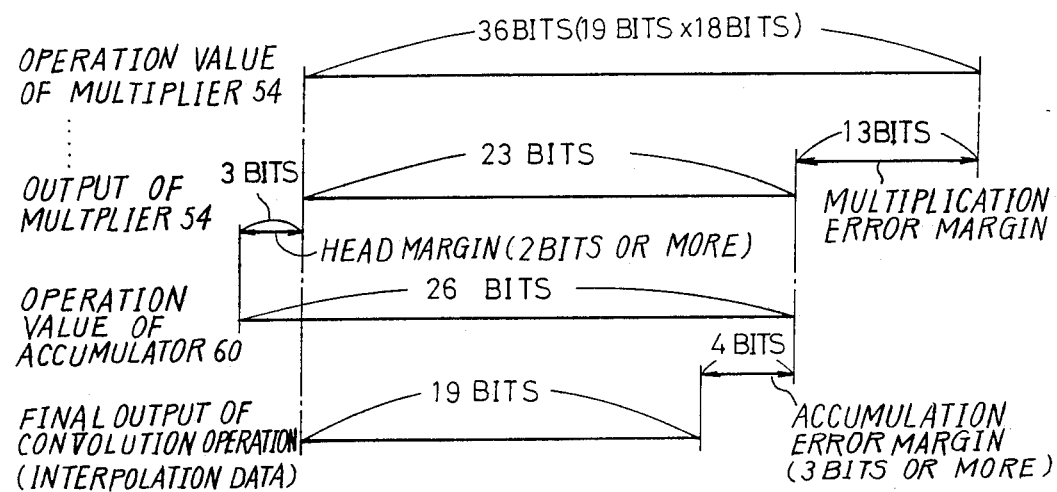
FIG. 10 is a diagram showing relation in the word length between outputs of some component parts in the circuit of FIG. 1.

The relation in the word length between some component parts of the circuit in FIG. 1 in the above described convolution operation is shown in FIG. 10. The multiplier 54 has the word length of 36 bits as described above and the 23 leftmost bits thereof are applied to the accumulator 60. Accordingly, the rightmost 13 bits including a rounding error is treated as a multiplication error.

The value of the accumulation by the accumulator 60 has a carry as the accumulation proceeds but the carry does not exceed three bits because the accumulated data is bit-shifted in the decreasing direction every four times of accumulation for each of the left and right channels. If, accordingly, a head margin of 2 bits or more is added to MSB of the output bits of the multiplier 54, the accumulated data will not exceed the word length of the accumulator 60. In this embodiment, a head margin of 3 bits is provided. The word length of the accumulator 60 becomes 26 bits. Since bit-shifting is made 14 times while the accumulation is performed 56 times, the accumulation is performed with the same accuracy as by an accumulator having 26+14=40 bits.

The rounding error of the multiplication data is accumulated by the accumulator 60 but the accumulated value of the rounding error is shifted down by bit-shifting performed every four times of accumulation for each of the left and right channels so that the rounding error does not exceed rightmost 3 bits. If, accordingly, an accumulation error margin of 3 bits or more is provided, the rounding error does not appear in the interpolation data. In this embodiment, an accumulation error margin of 4 bits is provided and 19 bits of higher orders are used for the interpolation data.

In the foregoing manner, each time new data is applied to the RAMs 38 and 44, the primary interpolation data is obtained. This primary interpolation data is subjected to overflow protection of 19 bits by an overflow protector 65.

The overflow protector 65 is provided for preventing overflow of the primary interpolation data and functions to fix values exceeding +6 dB as a maximum value. In 2's complement, a value exceeding a positive maximum value becomes a negative value so that it is necessary to prevent such exceeding of the value which will impede a proper function of the primary interpolation data.

The reason for performing the overflow protection using 19 bits, one bit larger than 18 bits with which data is finally provided from this digital filter, is that, by performing the secondary double oversampling by using as many bits as possible, the accuracy of the secondary double oversampling can be improved.

The primary interpolation data provided from the overflow protector 65 is distributed to the left and right channels by latch circuits 70 and 74 and successively applied to RAMs 72 and 76 for the secondary double oversampling.

For the secondary double oversampling, coefficients of 41 orders are employed (commonly for the left and right channels). The number of coefficients of this order is sufficient for the secondary double oversampling. In the secondary double oversampling also, multiplication of zero data is unnecessary and input data held by the RAMs 40 and 46 are outputted directly from an output line 68. As for the primary interpolation data, the primary interpolation data held by the RAMs 72 and 76 are outputted directly from an output line 71. Since every other coefficient of these coefficients of 41 orders becomes zero, 20 coefficients have only to be prepared! These 20 coefficients for the secondary double oversampling are stored by the coefficient ROM 58 in the form of mantissa. The 20 mantissa data are multiplied with input data and the primary interpolation data alternately so that 10 input data and 10 primary interpolation data may be prepared for each of the left and right channels. Accordingly, the RAMs 72 and 76 hold the newest 10 primary interpolation data for each of the left and right channels The input data used for the secondary double oversampling are data intermediate the respective primary interpolation data held by the RAMs 72 and 76 and are the newest 10 data held by the RAMs 40 and 46.

In the secondary double oversampling, the 20 secondary double oversampling mantissa data stored by the coefficient ROM 58 are successively read out from data of the smallest exponent. In synchronization with this reading of the mantissa data, corresponding input data or primary interpolation data is read out from the RAM 40 or 46 or RAM 72 or 76. The read out input data is supplied to the multiplier 54 through the selector 42 and the full adder 50 (merely passing without performing addition) and the selector 52 and the read out primary interpolation data is supplied to the multiplier 54 through selectors 56 and 52. The input data and primary interpolation data are multiplied with the mantissa data in the multiplier 54 alternately for the left and right channels. A delay circuit 78 performs the same function as the delay circuit 48, i.e., synchronizing timings for enabling the same clock operation. The selector 56 is provided for outputting data of the left and right channels on a time shared basis in the same manner as the selector 42. The selector 52 selects either the input data or the primary interpolation data.

In the multiplier 54, multiplication is performed 20 times for the secondary double oversampling for each of the left and right channels and results of the multiplication are accumulated through the accumulator 60 and a delay circuit 62 which delays them by two data. In the accumulation, the accumulated data is bit-shifted in the decreasing direction by a bit-shifting circuit 64 by the amount of difference in the exponent whereby relative imparting of exponents is performed. Upon completion of accumulation of 20 results of the multiplication for each of the left and right channels, the final value of accumulation is obtained as the secondary interpolation data. Since two interpolation data can be inserted during one sampling period, another secondary interpolation data is prepared by a similar operation. In this case, this secondary interpolation data is produced by shifting the secondary double oversampling coefficient data by one bit as compared with preceding coefficient data and multiplying the input data and the primary interpolation data with this shifted coefficient data.

The two secondary interpolation data for the left and right channels obtained in the above described manner are once held by a register 84 through an overflow protector and selector 82 (performing a final protection of +0 dB). On the other hand, the primary interpolation data intermediate these two secondary interpolation data for the left and right channels are read out from the RAMs 72 and 76 and are once held by the register 84 through the signal line 71 and the overflow protector and selector 82. Further, input data adjacent to one of the secondary interpolation data for the left and right channels (held by the RAMs 40 and 46) are once held by the register 84 through the signal line 68 and the overflow protector and selector 82.

In this manner, four data consisting of one input data, one primary interpolation data adjacent to this input data and two secondary interpolation data adjacent to this primary interpolation data for each of the left and right channels (total of eight data) are held by the register 84. From this register 84 is sequentially outputted the input data, one of the secondary interpolation data, the primary interpolation data and the other secondary interpolation data at an interval of ¼ fs. Since the data of the left and right channels are outputted on a time shared basis, the four data of one channel are outputted alternately with the four data of the other channel.

The quadruple oversampled data outputted by the register 84 are converted by a parallel-to-serial conversion circuit 86 to serial data and thereafter are supplied from an output terminal 90 to a digital-to-analog converter (not shown).

A timing control circuit 92 is provided for synchronizing timings of respective portions of this digital filter.

As described above, the digital filter of FIG. 1 performs the primary double oversampling once and the secondary double oversampling twice each time input data is applied and thereby produces quadruple oversampling data.

Figure 11:
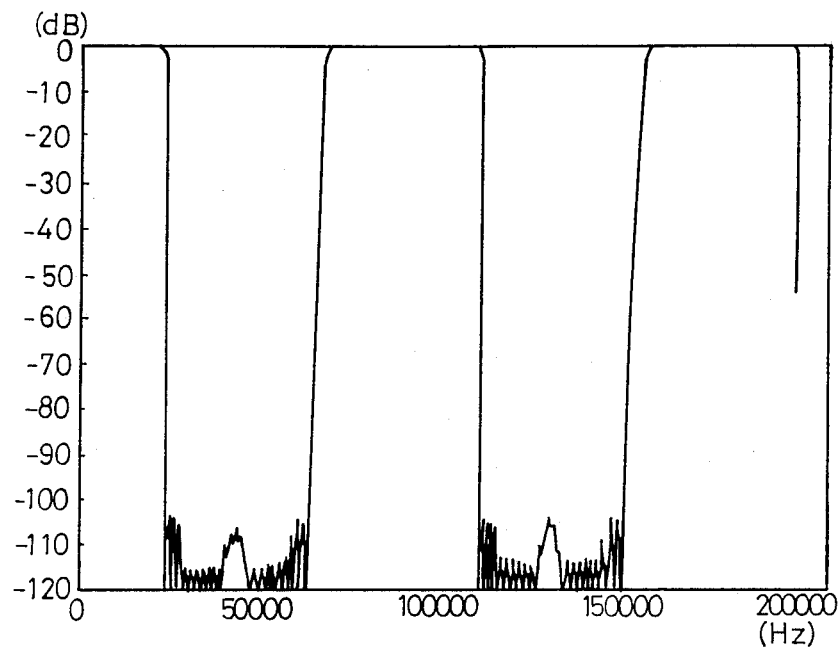
FIG. 11 is a diagram showing frequency characteristics of a primary double oversampling filter used in the circuit of FIG. 1.
Figure 12:
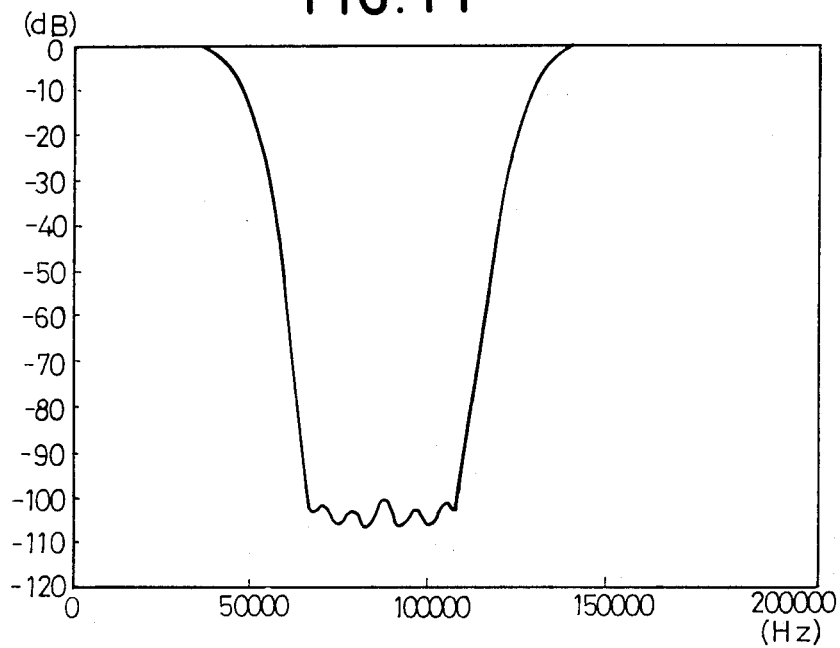
FIG. 12 is a diagram showing frequency characteristics of a secondary double oversampling filter used in the circuit of FIG. 1.
Figure 13:
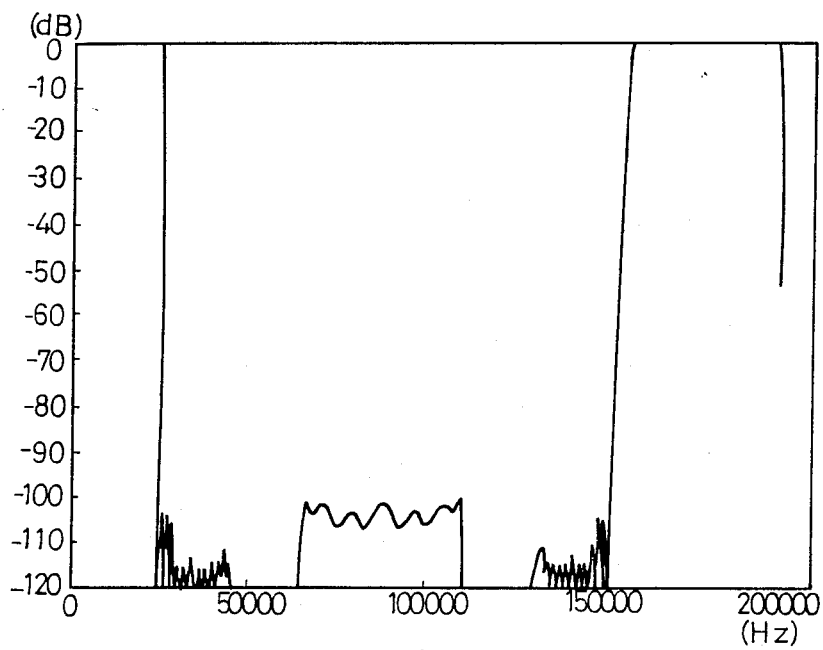
FIG. 13 is a diagram showing total frequency characteristics of the primary and secondary oversamplings performed in the digital filter of FIG. 1.
Figure 14:
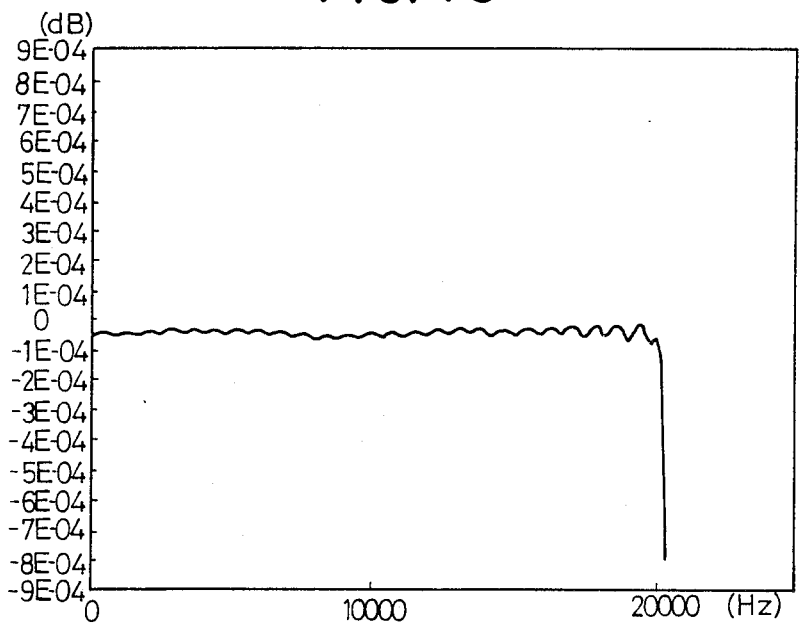
FIG. 14 is a diagram showing pass band ripple characteristics in the digital filter of FIG. 1.

Frequency characteristics of the primary double oversampling filter and the secondary double oversampling filter used in the digital filter shown in FIG. 1 are illustrated by FIGS. 11 and 12. Total frequency characteristics of the quadruple oversampling frequency characteristics realized by the two filters are shown in FIG. 13 and pass band ripple characteristics of the quadruple oversampling are shown in FIG. 14. As will be seen in the figures, the pass band ripple within 0.0001 dB and the attenuating band attenuation below 100 dB are realized. Since the digital filter is of linear phase characteristics, the group delay is constant.

In the above described embodiment, the invention is applied to a digital low-pass filter performing quadruple oversampling before digital-to-analog conversion in a Compact Disc player for filtering of 2's complemental code signals. The invention however is applicable to devices other than a Compact Disc player. The invention is also applicable not only to a low-pass filter but also to a band-pass filter and high-pass filter. The invention is further applicable to a filter which does not perform oversampling and to data which is expressed by a code other than the 2's complement binary code.

In the above described embodiment, coefficients having the monotonously decreasing characteristics are used with the resulting advantage that rearrangement of the sequence of the coefficients is unnecessary. Alternatively, the sequence of coefficients may be rearranged so that they are arranged in the order from the smallest exponent, depending upon filter characteristics to be established. In this case, selection of input data is performed in accordance with the rearranged sequence of coefficients. In the above described embodiment, the number of bit shifted in one shifting is one bit but two or more bits may be shifted in one shifting.

In the above described embodiment, the exponent information is substituted by hardware. Alternatively, the exponent information may be stored in a ROM or may be obtained by calculation at each convolution operation.

What is claimed is:

1. A digital filter of non-recursive type operating as oversampling filter in digital signal processing comprising:

a memory storing impulse response coefficient data;

mantissa data producing means for providing mantissa data of the coefficient data of a predetermined bit number;

a multiplier for multiplying input data with the mantissa data;

an accumulator for accumulating output data of said multiplier; and bit-shifting means for bit-shifting accumulated output data of said accumulator by the number of bits substantially corresponding to the change in the number of bits of exponent data in said coefficient data;

wherein said coefficient data is read out from said memory in order from the smallest exponent being multiplied with the unput data and the bit-shifting of the accumulated output data by said bit-shifting means is made in a decreasing direction.

2. A digital filter as defined in claim 1 wherein the bit number of the exponent data in the coefficient data changes substantially linearly and said bit-shifting means counts the number of times of accumulation by said accumulator and performs bit-shifting of the accumulated output data each time the count has reached a predetermined count.

3. A digital filter as defined in claim 2 wherein said mantissa data of the coefficient data is stored in said memory, and said mantissa data producing means provides the mantissa data by reading out the mantissa data from the memory.

4. A digital filter as defined in claim 3 wherein said digital signal processing is made for processing signals of left and right channels of a stereophonic audio device and these signals are processed on a time shared basis.

5. A digital filter as defined in claim 4 wherein said digital filter is of linear phase characteristics in which impulse response is arranged in a symmetrical sequence with respect to a center of the impulse response and which further comprises:

a second memory and a third memory respectively storing input data of a word length to be accumulated by said accumulator; and an adder for adding words read out from said second and third memories to be multiplied with a common one of the coefficient data and supplying a sum output to said multiplier.

6. A digital filter as defined in claim 5 wherein said bit-shifting means produces primary interpolation data to be interpolated at an intermediate timing of one sampling period and which further comprises:

a fourth memory temporarily storing said primary interpolation data, secondary interpolation data to be inserted between the input data and the primary interpolation data being produced from output of said fourth memory and the input data; and a register holding said input data, primary interpolation data and secondary interpolation data and outputting sequentially these data during each sampling period whereby an output signal interpolated with said primary and secondary interpolation data is obtained during each sampling period.

* * * * *